(12) United States Patent
Lee et al.

(10) Patent No.: US 8,723,591 B2
(45) Date of Patent: May 13, 2014

(54) METHOD FOR DRIVING IGBT

(75) Inventors: Gyeong Ho Lee, Cheongju-si (KR); Hae Yong Park, Masan-si (KR); Seung Hyun Bang, Busan (KR); Jung Wook Sim, Cheongju-si (KR); Won Joon Choe, Cheongju-si (KR); Min Jee Kim, Seoul (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 0 days.

(21) Appl. No.: 13/530,008

(22) Filed: Jun. 21, 2012

(65) Prior Publication Data

US 2013/0021067 A1  Jan. 24, 2013

(30) Foreign Application Priority Data

Jul. 22, 2011 (KR) .................. 10-2011-0073229

(51) Int. Cl.
*H03K 17/16* (2006.01)
*H03K 17/51* (2006.01)

(52) U.S. Cl.
USPC .......................... 327/432; 323/271

(58) Field of Classification Search
None
See application file for complete search history.

(56) References Cited

U.S. PATENT DOCUMENTS

| | | | | |
|---|---|---|---|---|
| 5,559,656 A | * | 9/1996 | Chokhawala | 361/18 |
| 5,936,387 A | * | 8/1999 | Tabata et al. | 323/225 |
| 5,986,484 A | * | 11/1999 | Kimata | 327/108 |
| 6,333,665 B1 | | 12/2001 | Ichikawa | |
| 6,541,826 B2 | * | 4/2003 | Iwagami et al. | 257/379 |
| 6,845,022 B2 | * | 1/2005 | Yoshimura et al. | 363/95 |
| 7,570,101 B1 | * | 8/2009 | Short et al. | 327/432 |
| 7,710,187 B2 | * | 5/2010 | Hiyama | 327/374 |
| 7,737,737 B2 | * | 6/2010 | Higashi et al. | 327/112 |
| 8,362,812 B2 | * | 1/2013 | Lee | 327/109 |
| 8,400,739 B2 | * | 3/2013 | Ioannidis et al. | 361/18 |
| 2002/0070772 A1 | | 6/2002 | Neacsu et al. | |
| 2007/0279119 A1 | * | 12/2007 | Onozawa | 327/377 |
| 2012/0032710 A1 | * | 2/2012 | Tsukada | 327/109 |

FOREIGN PATENT DOCUMENTS

| | | |
|---|---|---|
| GB | 2433358 | 6/2007 |
| JP | 2000-253646 | 9/2000 |
| JP | 2009-071956 | 4/2009 |
| KR | 10-0218220 | 9/1999 |
| KR | 10-2009-0107776 | 10/2009 |

OTHER PUBLICATIONS

Korean Intellectual Property Office Application Serial No. 10-2011-0073229, Office Action dated Aug. 31, 2012, 4 pages.
European Patent Office Application Serial No. 12173744.9, Search Report dated Nov. 21, 2012, 7 pages.
Korean Intellectual Property Office Application Serial No. 10-2011-0073229, Office Action dated Aug. 28, 2013, 4 pages.
Japan Patent Office Application Serial No. 2012-161511, Office Action dated Oct. 15, 2013, 4 pages.

* cited by examiner

*Primary Examiner* — Lincoln Donovan
*Assistant Examiner* — Terry L Englund
(74) *Attorney, Agent, or Firm* — Lee, Hong, Degerman, Kang & Waimey

(57) ABSTRACT

A method for driving an IGBT, wherein a transient voltage applied across the IGBT is reduced by altering a rate of change of a gate-emitter voltage of the IGBT.

3 Claims, 4 Drawing Sheets

METHOD FOR DRIVING IGBT

Pursuant to 35 U.S.C. §119 (a), this application claims the benefit of earlier filing date and right of priority to Korean Patent Application No. 10-2011-0073229, filed on Jul. 22, 2011, the contents of which is hereby incorporated by reference in their entirety.

BACKGROUND OF THE DISCLOSURE

1. Field of Endeavor

The present disclosure relates to a method for driving an IGBT, and more particularly to a method for driving an IGBT employed as a power device for a current limiter.

2. Background

The IGBT (Insulated Gate Bipolar Transistor) is a voltage-driven device through gate-emitter terminals that combines simple gate-drive characteristics of MOSFETs (Metal Oxide Semiconductor Field Effect Transistors) with a high-current and low-saturation-voltage capability of BJTs (Bipolar Junction Transistors).

The IGBT has a high input impedance like the MOSFET, and a high-current and low-saturation-voltage capability of BJTs.

FIG. 1a is a schematic view illustrating symbols used in IGBT, where D refers to a diode, C refers to a collector, E refers to an emitter and G refers to a gate.

FIG. 1b is a graph illustrating a characteristic of turn-off at the IGBT. If a gate voltage surpasses a threshold voltage based on a gate electrostatic capacity, the IGBT is turned on, and turned off if the gate voltage goes down below the threshold voltage.

A collector-emitter voltage (VCE) generated during switching of IGBT is generated by transient voltage caused by stray inductance on a conductive line and input voltage. Thus, there is needed an IGBT driving technology capable of limiting a transient voltage level.

FIG. 2 is a schematic view illustrating an IGBT driving method according to prior art.

Referring to FIG. 2, a transient voltage $V_{ce}$ is generated across an IGBT in a parallel circuit where a conventional IGBT 100 and passive elements R, L and C 200 are connected in parallel during turn-off operation of a current flowing to the IGBT 100. The transient voltage has an absolute influence to damage of IGBT 100.

Snubber circuits 300 are connected in parallel to prevent the transient voltage in the conventional IGBT circuit. The term of snubber refers to an auxiliary circuit element or combination of elements used for alleviating the transient voltage in a semiconductor device. The snubber circuit is largely formed with an RC (Resistor-Capacitor) or an RCD (Resistor-Capacitor-Diode). However, the snubber circuit 300 needs much more number of passive power elements during high voltage design, such that the passive elements cause a problem of generating an additional loss during IGBT operation.

SUMMARY OF THE DISCLOSURE

The present disclosure has been made to solve the foregoing problem(s) of the prior art, and therefore an object of certain embodiments of the present invention is to provide a method for driving an IGBT configured to control a slope of a gate-emitter voltage that is an IGBT control signal.

In one general aspect of the present disclosure, there is provided a method for driving an IGBT configured to reduce a transient voltage applied across the IGBT during turn-off of an IGBT driver IC (Integrated Circuit), the method comprising: reducing a slope of a gate-emitter voltage of the IGBT to reduce the transient voltage across the IGBT.

Preferably, but not necessarily, the step of reducing a slope of a gate-emitter voltage of the IGBT is performed by changing an inner resistance of the IGBT driver IC.

Preferably, but not necessarily, the inner resistance of the IGBT driver IC is changed to substantially 25 kΩ.

Preferably, but not necessarily, the step of reducing a slope of a gate-emitter voltage of the IGBT is performed by lengthening a holding time of a threshold voltage of IGBT.

The method for driving IGBT according to the present disclosure has an advantageous effect in that a voltage applied across the IGBT during the current cut-off can be efficiently reduced by controlling a slope of a gate-emitter voltage that is an IGBT control signal and by reducing a slope of a current during current cut-off of IGBT.

BRIEF DESCRIPTION OF THE DRAWINGS

The drawing figures depict one or more exemplary embodiments in accord with the present concepts, by way of example only, not by way of limitations. In the figures, like reference numerals refer to the same or similar elements.

Thus, a wide variety of potential practical and useful embodiments will be more readily understood through the following detailed description of certain exemplary embodiments, with reference to the accompanying exemplary drawings in which:

FIG. 4b is a graph illustrating a voltage across the IGBT of FIG. 4a.

DETAILED DESCRIPTION

Figure 1A:
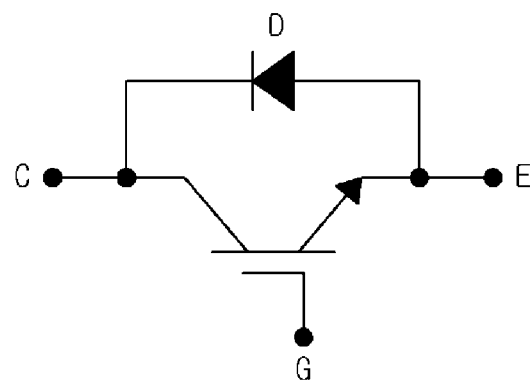
FIG. 1a is a schematic view illustrating symbols used in IGBT.
Figure 1B:
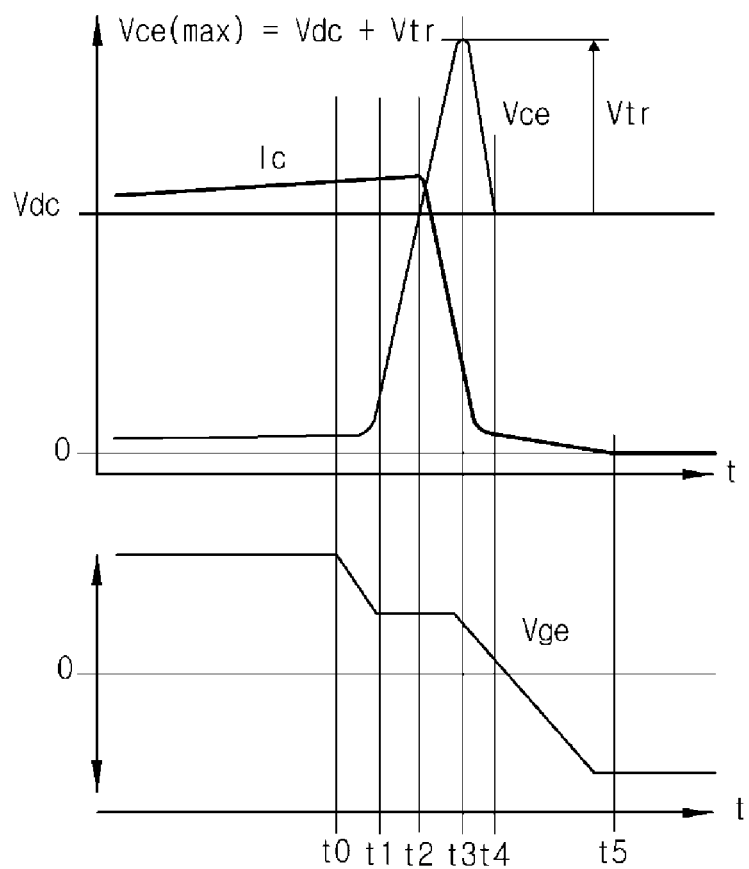
FIG. 1b is a graph illustrating a characteristic of turn-off at the IGBT.

The disclosed embodiments and advantages thereof are best understood by referring to FIGS. 1-4 of the drawings, like numerals being used for like and corresponding parts of the various drawings. Other features and advantages of the disclosed embodiments will be or will become apparent to one of ordinary skill in the art upon examination of the following figures and detailed description. It is intended that all such additional features and advantages be included within the scope of the disclosed embodiments, and protected by the accompanying drawings. Further, the illustrated figures are only exemplary and not intended to assert or imply any limitation with regard to the environment, architecture, or process in which different embodiments may be implemented. Accordingly, the described aspect is intended to embrace all such alterations, modifications, and variations that fall within the scope and novel idea of the present invention.

Meanwhile, the terminology used herein is for the purpose of describing particular implementations only and is not intended to be limiting of the present disclosure. The terms "first," "second," and the like, herein do not denote any order, quantity, or importance, but rather are used to distinguish one element from another. For example, a second constituent element may be denoted as a first constituent element without departing from the scope and spirit of the present disclosure, and similarly, a first constituent element may be denoted as a second constituent element.

As used herein, the terms "a" and "an" herein do not denote a limitation of quantity, but rather denote the presence of at least one of the referenced item. That is, as used herein, the singular forms "a", "an" and "the" are intended to include the plural forms as well, unless the context clearly indicates otherwise.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Also, "exemplary" is merely meant to mean an example, rather than the best. If is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated.

That is, in the drawings, the size and relative sizes of layers, regions and/or other elements may be exaggerated or reduced for clarity. Like numbers refer to like elements throughout and explanations that duplicate one another will be omitted. As may be used herein, the terms "substantially" and "approximately" provide an industry-accepted tolerance for its corresponding term and/or relativity between items.

Hereinafter, a method for driving IGBT according to the present disclosure will be described in detail with reference to the accompanying drawings.

Figure 2:
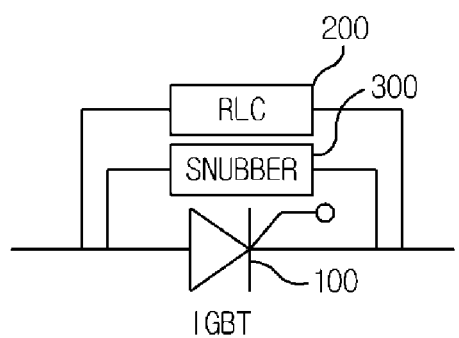
FIG. 2 is a schematic view illustrating an IGBT driving method according to prior art.

The present disclosure proposes a method for changing a VGE characteristic for controlling an IGBT current, in order to remove a snubber circuit (300) of FIG. 2 and to reduce a transient voltage across an IGBT during IGBT current cut-off operation. That is, the present disclosure uses an IGBT switching technology, instead of forming a snubber circuit, to prevent the IGBT from being damaged by the transient voltage.

Figure 3:
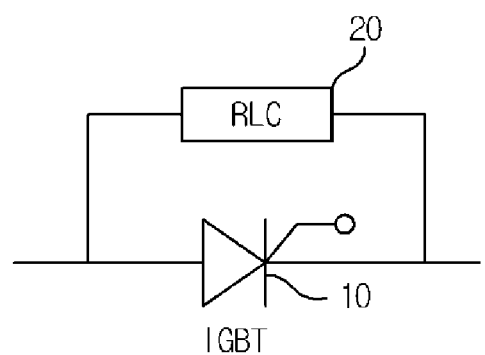
FIG. 3 is a schematic view illustrating a method for driving an IGBT according to an exemplary embodiment of the present disclosure.

FIG. 3 is a schematic view illustrating a method for driving an IGBT according to an exemplary embodiment of the present disclosure.

Referring to FIG. 3, the IGBT driving according to the present disclosure is performed by an IGBT driver IC (not shown). That is, although not shown, the IGBT driving according to the present disclosure is performed by an IC (Integrated Circuit) connected to the IGBT.

As shown in the figure, an IGBT driving circuit is formed in parallel with an IGBT 10 and a passive element 20 including a resistor (R), an inductor (L) and a capacitor (C), and the IGBT driving IC (not shown) is configured to transmit a control signal to the IGBT 10.

A transient voltage ($V_{ce}$) across the IGBT 10 or a peak voltage during turn-off operation of the IGBT 10 is determined by Ldi/dt, where L refers to an inductance of the inductor included in the parallel-connected passive element 20, and di/dt refers to a slope of a current during the turn-off operation.

That is, either the inductance L is reduced or the slope of turned-off current is reduced to reduce the transient voltage. However, reducing the inductance L is limited due to circuit configuration, such that it would be more effective to reduce the slope of the current.

Therefore, the present disclosure proposes a method of changing a slope of $V_{GE}$ (i.e., the rate of change of $V_{GE}$ over time) which is a control signal of IGBT in order to reduce the turned-off current. That is, a level of current conducted on the IGBT is changed in response to a value of $V_{GE}$ which is a control signal of IGBT, such that the slope of current during the IGBT turn-off operation can be reduced by control of $V_{GE}$ FIG. 4a is a graph illustrating changed slopes of VGE according to an exemplary embodiment of the present disclosure, and FIG. 4b is a graph illustrating a voltage across the IGBT of FIG. 4a.

Figure 4A:
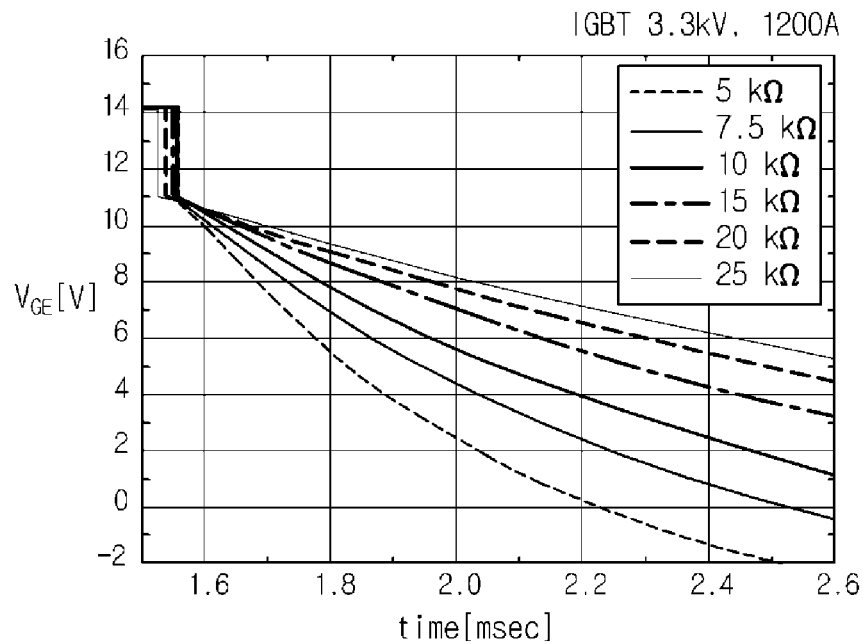
FIG. 4a is a graph illustrating changed slopes of VGE according to an exemplary embodiment of the present disclosure.
Figure 4B:
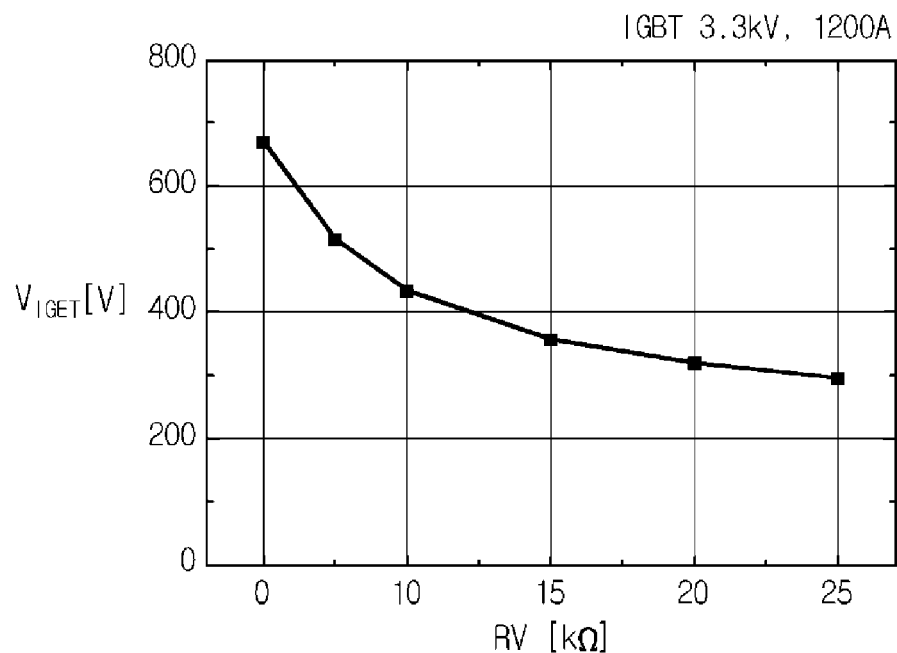

Referring to FIGS. 4a and 4b, the method for driving the IGBT according to an exemplary embodiment of the present disclosure is to change the slope of $V_{GE}$, as a method for changing an inner resistance of the IGBT driver IC (not shown).

That is, it can be noted from FIG. 4a that the slope of $V_{GE}$ is reduced when an inner resistance (i.e., an internal gate resistance) of the IGBT driver IC is 25 kΩ instead of 5 kΩ, where it can be noted that a voltage ($V_{IGBT}$) across the IGBT is also reduced.

As noted above, the method for driving IGBT is to reduce the voltage across the IGBT by reducing the slope of $V_{GE}$ through increased inner resistance of the IGBT driver IC.

However, it should be apparent that the method of reducing the slope of $V_{GE}$ is not limited to the increased inner resistance of the IGBT driver IC, but can be done by lengthening a holding time of a threshold voltage, for example.

The method for driving the IGBT proposes a method of reducing a slope of $V_{GE}$, which is a gate-emitter control signal of IGBT inputted from the IGBT driver IC, in order to reduce a slope of turned-off current. The level of current conductive to the IBGT is changed by the value of $V_{GE}$, which is an IGBT control signal, where the slope of current during IGBT turn-off operation can be reduced by control of $V_{GE}$.

The method for driving IGBT according to the present disclosure has an industrial applicability in that a voltage applied across the IGBT during the current cut-off can be efficiently reduced by controlling a slope of a gate-emitter voltage that is an IGBT control signal and by reducing a slope of a current during current cut-off of IGBT.

Although the present disclosure has been described with reference to a number of illustrative embodiments thereof, it should be understood that numerous other modifications and embodiments can be devised by those skilled in the art that will fall within the spirit and scope of the principles of this disclosure.

More particularly, various variations and modifications are possible in the component parts and/or arrangements of subject combination arrangement within the scope of the disclosure, the drawings and the appended claims. In addition to variations and modifications in the component parts and/or arrangements, alternative uses will also be apparent to those skilled in the art.

What is claimed is:

1. A method for driving an insulated-gate bipolar transistor (IGBT) configured to reduce a transient voltage applied across the IGBT during turn-off of an IGBT driver IC (Integrated Circuit), the method comprising:

altering a rate of change of a gate-emitter voltage of the IGBT to reduce the transient voltage across the IGBT, wherein the altering comprises:
  causing the gate-emitter voltage of the IGBT to be instantaneously discharged to a predetermined degree, and
  causing the gate-emitter voltage of the IGBT to be discharged gradually at a constant current discharge rate following the discharge to the predetermined degree without delay.

2. The method of claim 1, wherein the altering the rate of change of the gate-emitter voltage further comprises changing an internal gate resistance of the IGBT driver IC.

3. The method of claim 2, wherein the internal gate resistance of the IGBT driver IC is changed to 25 kΩ.

* * * * *